United States Patent [19]

Bertagnolli

[11] Patent Number: 5,217,909
[45] Date of Patent: Jun. 8, 1993

[54] METHOD FOR MANUFACTURING A BIPOLAR TRANSISTOR

[75] Inventor: Emmerich Bertagnolli, Munich, Fed. Rep. of Germany

[73] Assignee: Siemens Aktiengesellschaft, Munich, Fed. Rep. of Germany

[21] Appl. No.: 712,563

[22] Filed: Jun. 10, 1991

[30] Foreign Application Priority Data

Jul. 18, 1990 [DE] Fed. Rep. of Germany ....... 4022892

[51] Int. Cl.$^5$ .................... H01L 21/265; H01L 29/70
[52] U.S. Cl. ........................................ 437/31; 257/47; 148/DIG. 10; 148/DIG. 11
[58] Field of Search .................. 437/31; 357/34; 148/DIG. 10, DIG. 11; 359/59 H

[56] References Cited

U.S. PATENT DOCUMENTS

| | | | |
|---|---|---|---|
| 4,322,882 | 4/1982 | Vora | 357/59 |
| 4,407,060 | 10/1983 | Sakurai | 357/59 |
| 5,013,677 | 3/1991 | Hozumi | 437/31 |
| 5,024,971 | 6/1991 | Baker et al. | 437/31 |

OTHER PUBLICATIONS

Treitinger et al., "Ultra-Fast Silicon Bipolar Technology", Springer Series in Electronics and Photonics (1988).
Ning et al., "Self-Aligned Bipolar Transistors for High-Performance and Low-Power-Delay VLSI", IEEE Transactions on Electron Devices, vol. 28, No. 9, pp. 1010-1013 (1981).
Li et al., "Bipolar Transistor with Self-Aligned Lateral Profile", IEEE Electron Device Letters, vol. 8, No. 8, pp. 338-340 (1987).
Ehinger et al., "Pedestal Collector in Advanced Bipolar Technology for Improved Speed Power Performance", 19th European Solid State Device Research Conference, pp. 797-800 (1989).
Widmann et al., "Reihe Halbleiter Elektronik" vol. 16 pp. 293-297 (1988).

*Primary Examiner*—Olik Chaudhuri
*Assistant Examiner*—Long Pham
*Attorney, Agent, or Firm*—Hill, Steadman & Simpson

[57] ABSTRACT

A method for manufacturing a bipolar transistor in which the base, emitter and collector terminals are produced from a single, planar layer of, for example, polysilicon, directly deposited onto a substrate. The planar layer is doped by a first conductivity type for the base terminal. After masking with an implantation mask, covering a region of the planar layer for the base terminal and defining regions of the planar layer for the emitter and collector terminals, the regions for the emitter and collector terminals are doped by an implantation of a second conductivity type, the second conductivity type being opposite the first conductivity type. After a self-aligned supplementation of the implantation mask, for example, with the assistance of a spacer technique, with which the regions of the planar layer for the emitter and collector terminals are also covered, the planar layer is structured by anisotropic etching by using the supplemented implantation mask as an etching mask.

13 Claims, 7 Drawing Sheets

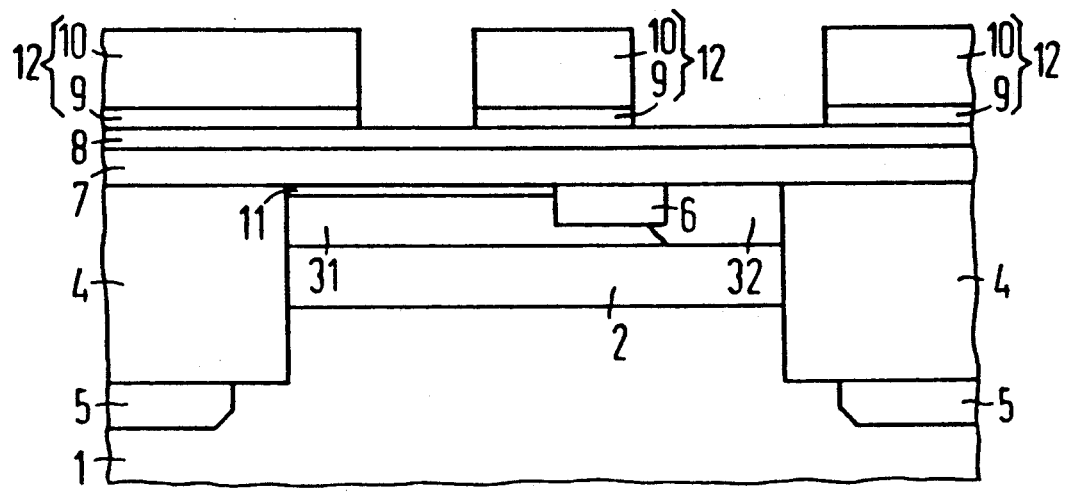
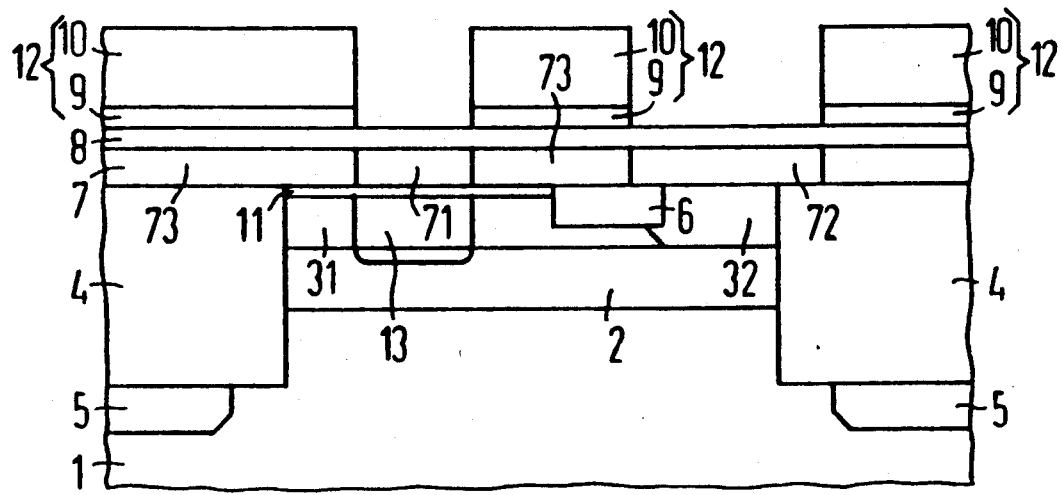

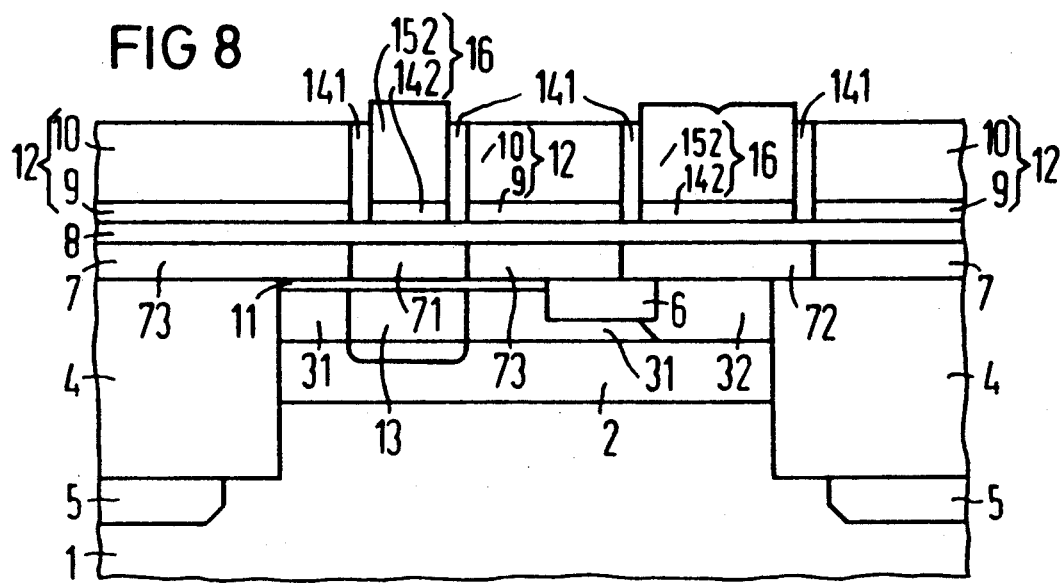
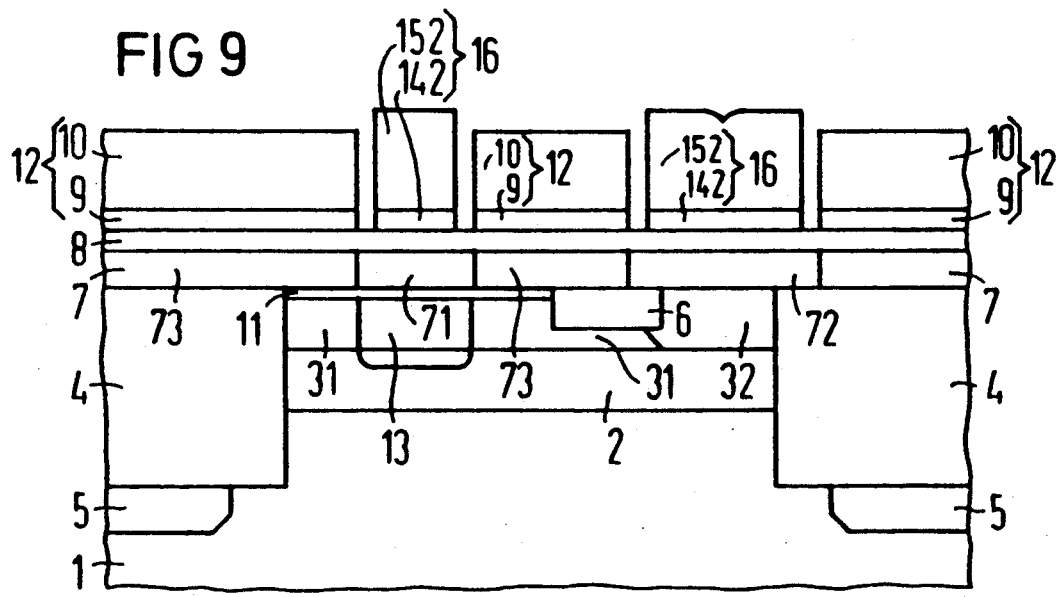

METHOD FOR MANUFACTURING A BIPOLAR TRANSISTOR

FIELD OF THE INVENTION

The present invention relates to a method for manufacturing a bipolar transistor.

BACKGROUND OF THE INVENTION

Bipolar transistors, integrated in a substrate, can be manufactured in self-aligned double silicon processes, as discussed in, for example, T. H. Ning et al., IEEE Trans. on Electron Devices, Vol. 28 (1981), and G. P. Li et al., IEEE Electron Device Letters, Vol.8 (1987). In such a manufacturing process, two oppositely doped polysilicon layers are successively applied onto a substrate. A base terminal arises from a first polysilicon layer, while emitter and collector terminals arise from a second polysilicon layer. The two polysilicon layers are separated by an oxide spacer. An oxide spacer is an insulating edge cover, produced either at the finished base terminal prior to the application of the second polysilicon layer, or at the finished emitter terminal prior to the application of the first polysilicon layer. As a result, the spacing between the base and emitter terminals becomes independent of the photolithographic process used.

One disadvantage of the above method is the extremely uneven topography of the resulting bipolar transistors, which is disadvantageous in LSI circuitry. Additionally, the above method requires re-etching steps when structuring the first polysilicon layer, and when forming oxide spacers. During the re-etching process, the substrate surface is eroded, resulting in a loss of the reference plane. Consequently, connecting problems arise in transistors manufactured in accordance with the above method.

A further disadvantage of the above method is that a plasma-assisted etching of the resulting emitter boundary surface is required when forming the spacers at the side walls of the base terminal, as well as when structuring the first polysilicon layer. Such plasma-assisted etching results in yield risks.

Moreover, the manufacture of transistors having oxide spacers at the side walls of the base terminals is not compatible with advanced technologies, such as deposited homobases, heterobases, or heteroemitters.

In addition, when the emitter terminal is manufactured first, and oxide spacers are used to cover the side walls of the emitter terminal, it is impossible to implement a selfaligned pedestal collector, which has an additional implantation of the collector in the active transistor region. Such pedestal collector is discussed in K. Ehinger et al., ESSDERC'89, (1989).

Yet another disadvantage of the above method arises from the difficulties of introducing silicide techniques for both the first and second polysilicon layers. When introducing silicide techniques, one of the silicides must withstand a high-temperature step without damaging the properties of the component. Thus, where the base terminal is produced first, and covered with oxide spacers, the silicide of the base terminal must withstand temperature steps during the out diffusion of donors for emitter formation without damage. On the other hand, when the emitter terminal is produced first, and provided with spacers, the silicide of the emitter terminal must withstand the temperature steps during the manufacture of the base terminal.

SUMMARY OF THE INVENTION

It is an object of the present invention to provide a method of manufacturing planar bipolar transistors that is compatible with advanced manufacturing technologies, and that reduces yield risks arising from etching plasma stressing.

The above object is inventively achieved in a method for manufacturing a bipolar transistor including the steps of producing a planar layer across the surface of a substrate, the planar layer being doped with a first conductivity type, producing a first auxiliary structure on the planar layer, the first auxiliary structure being selectively etchable with respect to the planar layer, the first auxiliary structure covering a region of the planar layer for a base terminal and defining regions of the planar layer for emitter and collector terminals, doping the regions of the planar layer for the emitter and collector terminals with a second conductivity type by ion implantation, using the first auxiliary structure as an implantation mask, the second conductivity type being opposite the first conductivity type, producing a second auxiliary structure, self-aligned with respect to the first auxiliary structure, the second auxiliary structure covering the regions for the emitter and collector terminals, the second auxiliary structure being selectively etchable with respect to the planar layer, and structuring the planar layer, using the first and second auxiliary structures together as an etching mask, to produce the base terminal and the emitter and collector terminals.

The bipolar transistor produced in accordance with the principles of the present invention has a planar surface, as the base, emitter and collector terminals of the bipolar transistor of the present invention are produced from a single layer of, for example, polysilicon. In contrast, a bipolar transistor manufactured according to the previously known method produces an uneven transistor surface.

Further, as the base, emitter and collector terminals are simultaneously produced from the planar layer in one etching step, an etching plasma stress, and the yield risks connected therewith, are eliminated in the region for the emitter.

In addition, depending on the type of bipolar transistor desired, the dopant concentration in the substrate for the active base region can be produced by implantation, diffusion or epitaxial deposition. When doping the base region by epitaxial deposition, the epitaxial deposition occurs before producing the planar layer. For example, a 50 nm thick layer of Si or $Si_{1-x}Ge_x$, where $X=0.1$ through 0.3 for the base and a 50 nm thick layer of Si or $Si_{1-x}Ge_x$, where $x=0.1$ through 0.3 for the emitter, can be deposited on a substrate of silicon. When doping the base region by diffusion, the doping occurs after producing the planar layer.

Moreover, the first auxiliary layer of the bipolar transistor of the present invention can be used as an implantation mask to produce a pedestal collector, below the emitter, with the use of an additional high-energy implantation of dopant of the second conductivity type.

In order to produce being self-aligned to the first auxiliary structure, a first auxiliary layer is deposited onto the entire surface of the first auxiliary structure and of the exposed regions of the planar layer providing a conformal step coverage. The first auxiliary layer is selectively etchable with respect to the first auxiliary structure and with respect to the planar layer. The thickness of the first auxiliary layer is determined, such that the surface of the first auxiliary layer has depressions that reflect the shape of the first auxiliary structure. A second auxiliary layer, selectively etchable with respect to the first auxiliary layer, is then formed on the first auxiliary layer. The second auxiliary layer covers the entire surface of the first auxiliary layer, and completely fills the depressions in the surface of the first auxiliary layer. The second auxiliary layer can be composed of, for example, a planarizing phosphorus-boronsilicate glass layer, or a silicon oxide layer, deposited to provide a conformal step coverage.

In order to produce the second auxiliary structure, the second auxiliary layer is re-etched until the surface of the first auxiliary layer outside the depressions is exposed. The exposed parts of the first auxiliary layer are subsequently re-etched down to the surface of the underlying planar layer. The width of the gap formed between the first and second auxiliary structures is defined by the thickness with which the first auxiliary layer is deposited. Since the deposition of layers having a thickness ranging from 200 through 5000 nm can be precisely controlled, spacings of a desired width in this range can be achieved.

BRIEF DESCRIPTION OF THE DRAWINGS

FIGS. 1 through 12 are cross sectional views of a bipolar transistor for explaining various steps of the method disclosed herein.

DESCRIPTION OF THE PREFERRED EMBODIMENTS

Figure 1:
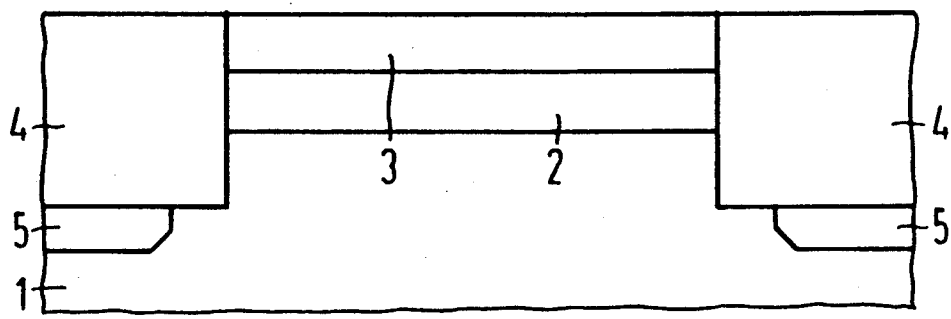

As illustrated in FIG. 1, a buried collector 2 is produced by, for example, implantation of n-doping ions in a substrate 1 of single-crystal, p-doped silicon. Subsequently, an n-doped epitaxial layer 3 is applied across the surface of the substrate 1. Insulating regions 4 and channel stopper regions 5 are then produced to separate adjacent transistors in the substrate 1. A photoresist mask is produced. Insulating regions 4 are subsequently produced by forming insulation wells, extending, for example, 100 through 500 nm deeper in the substrate 1 than the buried collector 2, by anisotropic etching, and filling the insulating wells in a CVD oxide. If necessary, the surface is then planarized by re-etching. Such an insulation technique, referred to as Box Insulation, is described in T. Shibata et al., IEDM Technology Digest, pages 27-30 (1983). Further, channel stopper regions 5 are produced, subsequent to forming and prior to filling the insulation wells, by implanatation with n-doping ions.

In another embodiment of the method of the present invention, the buried collector 2, epitaxial layer 3, insulating regions 4, and channel stopper regions 5 can be produced using a recessed oxide technique, as discussed in D. Widmann et al., Technologie Hochintegrierter Schaltungen, Reihe Halbleiter Elektronik, Volume 19, pages 293-297 (1988).

In a further embodiment, the buried collector 2, epitaxial layer 3, insulating regions 4, and channel stopper regions 5 can be produced using a trench insulation technique, as discussed in L. Treitinger et al., Ultrafast Silicon Bipolar Technology, Springer Series in Electronics and Photonics 27 (1988), pages 61-77.

Figure 2:
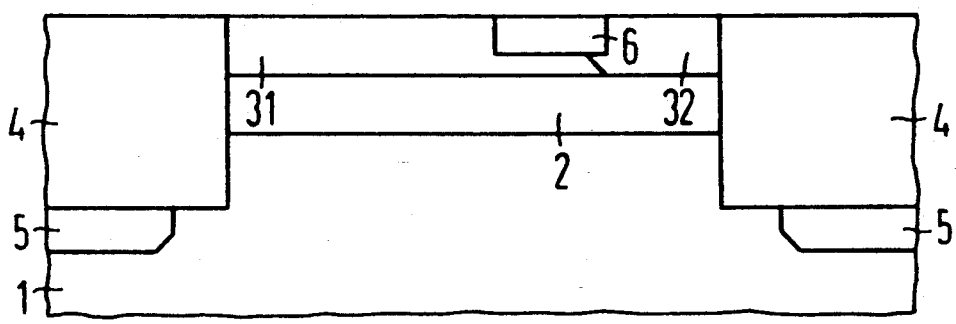

As illustrated in FIG. 2, production of the bipolar transistor of the present invention continues with the step of producing an oxide island 6 in the epitaxial layer 3. The oxide island 6 subdivides the epitaxial layer 3 into an epitaxial island 31, for accepting the later emitter/base region, and a collector terminal region 32. The collector terminal region 32 is produced by, for example, ion implantation and subsequent diffusion with n-doping ions, after appropriately masking regions other than the collector terminal region 32.

Figure 3:
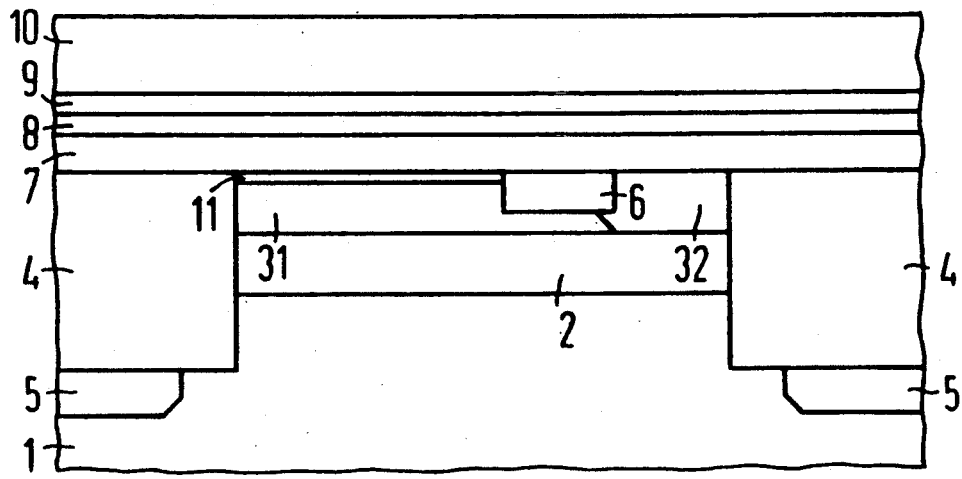

As illustrated in FIG. 3, a planar layer 7 is then applied across the surface of the insulating regions 4, the epitaxial island 31, the oxide island 6, and the collector terminal region 32. The planar layer 7 is electrically conductive, and is of a first conductivity type. For example, the planar layer 7 can be p-doped. Further, the planar layer 7 can be composed of, for example, polysilicon. The planar layer 7 is deposited, for example, either amorphously or as a crystalline with a thickness of 200 nm, in a CVD process. Doping of the planar layer 7 can occur either in situ during the deposition of the planar layer 7, or by implanation subsequent to the deposition of, for example, boron, having a dose of $8 \times 10^{15}$ cm$^{-2}$ and an energy of $10 \times eV$.

As further illustrated in FIG. 3, a first layer 8 is applied onto the planar layer 7. The first layer 8 is selectively etchable, with respect to the planar layer 7. The first layer 8 can consist of, for example, a silicon oxide, and can have a thickness of, for example, 50 nm. Subsequently, a second layer 9 is applied onto the first layer 8, the second layer 9 being selectively etchable with respect to the first layer 8. The second layer 9 can be composed of, for example, polysilicon, and can have a thickness of, for example, 50 nm. A third layer 10 is then deposited onto the second layer 9, and is selectively etchable with respect to the second layer 9. The third layer 10 can be composed of, for example, silicon oxide, and can have a thickness of, for example, 200 nm.

As further illustrated in FIG. 3, a base zone 11 is produced at the surface of the epitaxial island 31 by, for example, diffusion of the doping from the planar layer 7. Such a diffusion of the doping from the planar layer 7 is compensated for in the collector terminal region 32 by the opposite, higher doping of the collector terminal region 32.

In another embodiment, the base zone 11 is produced by an implantation of, for example, boron with a dose of $2.8 \times 10^{13}$ cm$^{-2}$ and an energy of 5 keV, prior to the deposition of the planar layer 7, and subsequent to an appropriate masking.

In yet another embodiment, the base zone 11 is produced by an epitaxial deposition of the base, prior to producing the planar layer 7, and a subsequent epitaxial deposition of an emitter zone, again, prior to producing the planar layer 7. By producing the base zone 11 in this manner, it is possible to deposit a homo-junction transistor having, for example, a 50 nm boron-doped base and 50 nm emitter. Further, it is possible to deposit a heterojunction transistor having, for example, 50 nm $Si_{1-x}Ge_x$ ($x=0.1$ through 0.3) for the base and 50 nm Si for the emitter. In addition, it is possible to manufacture a transistor having a homo-junction base and a heterojunction emitter, or hetero-junction base and hetero-junction emitter, when the base zone 11 is produced in accordance with this embodiment.

Referring to FIG. 4, a photoresist mask, covering the regions of the third layer 10 having underlying base terminals, is produced. Thus, the regions of the surface of the third layer 10 having underlying emitter and collector terminals remain exposed upon production of the photoresist mask. The third layer 10, of silicon oxide, is structured in accordance with the photoresist mask by anisotropic etching, such as, for example, reactive ion etching with $CHF_3/O_2$. As a result, the second layer 9 acts as etching stop. The photoresist mask is removed when the etching and, if necessary, a suitable aftertreatment for removing potential etching polymers, are completed.

Subsequently, the second layer 9 is structured by anisotropic etching, such as, for example, reactive ion etching with $BCl_3/Cl_2$. The photoresist mask can also be simultaneously removed while structuring the second layer 9. While structuring the second layer 9, the underlying first layer 8 serves as an etching stop, as illustrated in FIG. 4. The resulting structured second layer 9 and the resulting structured third layer 10 common side walls. Further, the second layer 9 in common with the third layer 10 form a first auxiliary structure 12.

Referring to FIG. 5, the planar layer 7 is doped in selected regions to form an emitter terminal 71 and a collector terminal 72. Such a doping can be effected by an implantation of donors, such as arsenic having a dose of $2 \times 10^{16}$ cm$^{-2}$ and energy of 80 keV. During the implantation, the regions of the planar layer 7 that form a base terminal 73 are covered by the first auxiliary structure 12. Other regions of the planar layer 7 that are not covered by the first auxiliary structure 12 must be shielded, prior to the implantation, with the assistance of an appropriate photoresist mask. During the implanation, the first layer 8 serves as a screen oxide, such that contamination of the planar layer 7, due to neutral particle current added to the ion current in the implanation, is avoided.

As illustrated in FIG. 5, a pedestal collector 13 is produced in the epitaxial island 31 under the base zone 11, and self-aligned relative to the emitter terminal 71. The pedestal collector 13 is produced by an additional high-energy implantation of donors, such as, for example, phosphorus. All other regions are shielded during the high-energy implantation. The pedestal collector 13 extends downwardly into the buried collector 2. The pedestal collector 13 improves the collector resistance, and thus, leads to a performance gain in the resulting transistor. Pedestal collectors are discussed in K. Ehinger et al., ESSDERC'89, page 797 (1989).

Figure 6:
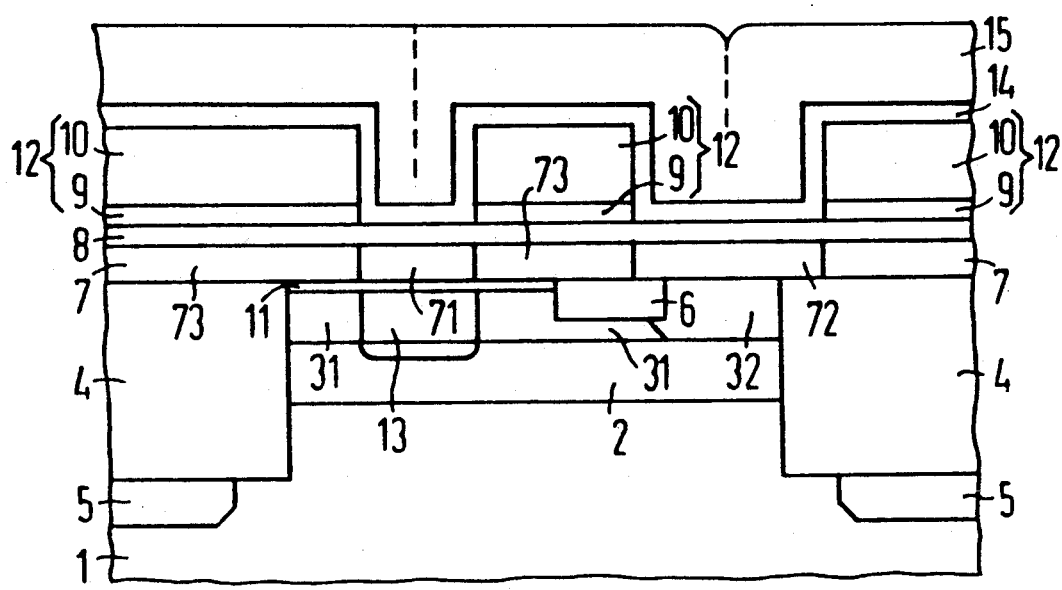

Referring to FIG. 6, a cleaning of the semiconductor wafer occurs after the doping is completed. A first auxiliary layer 14 is deposited with conformal step coverage, the exposed surface, the side walls of the first auxiliary structure 12, and the exposed surface of the first layer 8. The first auxiliary layer 14 is selectively etchable with respect to both the third layer 10 and the first layer 8. The first auxiliary layer 14 is composed of, for example, polysilicon, and has a thickness of, for example, 50 nm.

A second auxiliary layer 15 is deposited onto the first auxiliary layer 14. The second auxiliary layer 15 is deposited such that it completely fills the depressions in the first auxiliary layer 14, arranged over the emitter terminal 71 and over the collector terminal 72. Such a complete filling of the depressions is achieved by optimally conformal deposition of the second auxiliary layer 15 to the surface of the first auxiliary layer 14. The second auxiliary layer 15 is composed of, for example, silicon oxide. Alternatively, the depressions in the surface of the first auxiliary layer 14 can be filled by a second auxiliary layer 15 composed of a planarizing boron-phosphrous-silicate glass. The composition of the second auxiliary layer 15 is selected to permit selective etching with respect to the first auxiliary layer 14.

Figure 7:
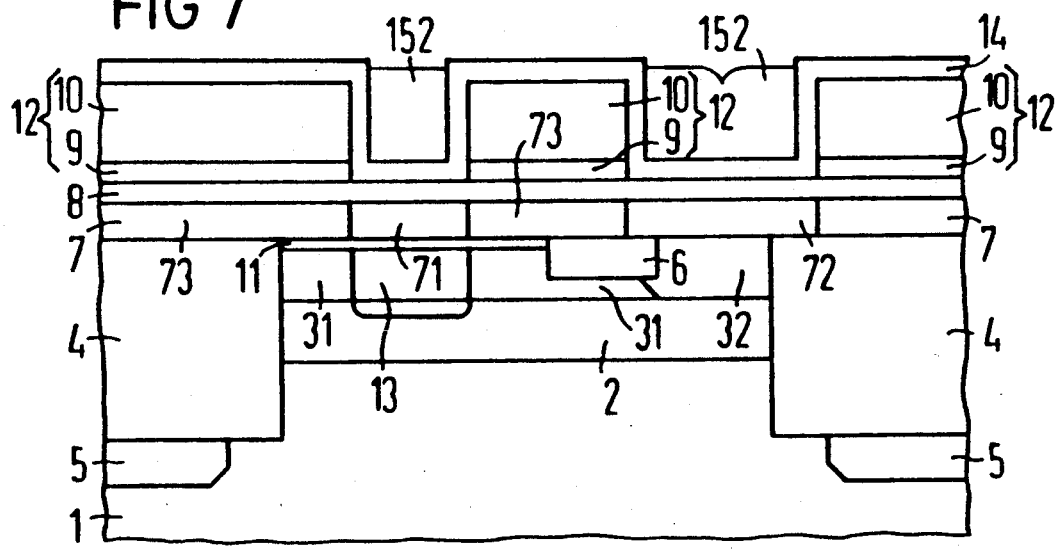

Referring to FIG. 7, the second auxiliary layer 15 is subsequently anisotropically re-etched, so that the surface of the first auxiliary layer 14 is exposed in the region above the base terminal 73. As a result, plug-shaped etching residues, or plugs, 152 remain in the region above the emitter terminal 71 and the collector terminal 72.

Referring to FIG. 8, the first auxiliary layer 14 is subsequently anisotropically re-etched. This can occur, for example, in two sub-steps. In a first sub-step, the exposed surface of the first auxiliary layer 14 is removed, and the surface of the first auxiliary structure 12 serves as an etching stop. After this first sub-step, vertical portions 141, arranged between the first auxiliary structure 12 and the plugs 152, and covered portions 142, arranged between the plugs 152 and the first layer 8, remain.

Referring to FIG. 9, in a second sub-step, the vertical portions 141 of the first auxiliary layer 14 are removed by anisotropic etching, and the surface of the first layer 8 serves as etching stop. As a result, a second auxiliary structure 16 is formed from the plugs 152, and from the covered portions 142 of the underlying first auxiliary layer 14. The second auxiliary structure 16 is arranged self-aligned with respect to the first auxiliary structure 12. An interspace between the first auxiliary structure 12 and the neighboring portions of the second auxiliary layer 16 is defined solely by the width of the vertical portions 141 of the first auxiliary layer 14 that have been removed. Thus, the interspace can be predetermined by selecting the thickness of the first auxiliary layer 14.

Subsequently, both the first auxiliary structure 12 and the second auxiliary structure 16 serve together as an etching mask for structuring the planar layer 7. The base terminal 73, emitter terminal 71 and the collector terminal 72 are then formed by etching the planar layer 7. As the second auxiliary structure 16 covers the emitter terminal 71 and collector terminal 72, and the first auxiliary structure 12 covers the base terminal 73, the interspace between the first auxiliary structure 12 and the second auxiliary structure 16 represents the spacing between the base terminal 73 and the emitter terminal 71. As discussed hereinabove, this interspace is determined by the thickness of the first auxiliary layer 14. The thickness of the first auxiliary layer 14 can be produced with a precision of 3%–5% in the range of 500–10 nm.

As a result of the inventive steps by which the first auxiliary structure 12 and for the second auxiliary structure 16 are produced, it is assured that the spaces formed between the first auxiliary structure 12 and the second auxiliary structure 16, due to removal of the vertical portions 141, are arranged at the edges of the emitter terminal 71 and the collector terminal 72. Thus, by using both the first auxiliary structure 12 and the second auxiliary structure 16 together as an etching mask for structuring the planar layer 7, the planar layer 7 is parted at the edges of the emitter terminal 71 and the collector terminal 72.

Figure 10:
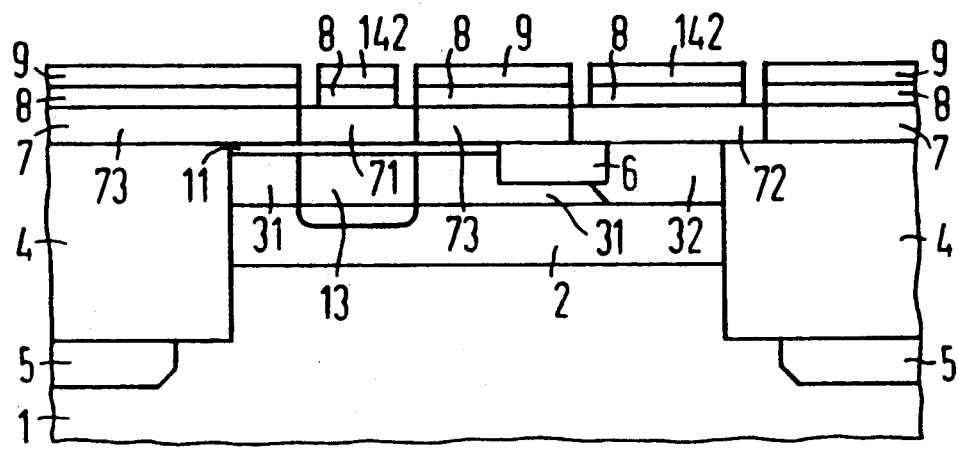

After structuring the planar layer 7, an anisotropic etching occurs such that plugs 152, or exposed silicon oxide, the third layer 10 and the exposed parts of the first layer 8 are removed, as illustrated in FIG. 10.

Figure 11:
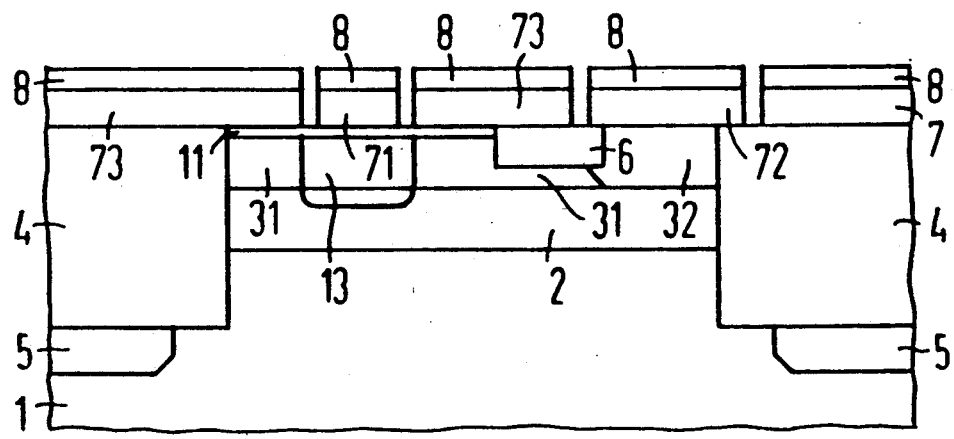

Subsequently, an anisotropic etching of the second layer 9, the covered portions 142 of the first auxiliary layer 14, that are now exposed, and the exposed portions of the planar layer 7 occurs. All of them are composed of polysilicon. This etching results in a complete removal of the second layer 9 and the covered portions 142, whereas the planar layer 7 is parted down to the surface of the base zone 11, or the oxide island 6, or the insulating region 4, respectively as illustrated in FIG. 11. The second layer 9, covered portions 142 of the first auxiliary layer 14, and the exposed portions of the planar layer 7 are composed of polysilicon.

In order to gain better control of the end point on the base zone 11, it is advantageous to first remove the large-area portions of the second layer 9 and the covered portions 142, where the first layer 8 of silicon oxide serves as an etching stop. Subsequently, the planar layer 7 is completely parted with a precisely defined re-etching, resulting in the formation of the emitter terminal 71, the collector terminal 72 and the base terminal 73. When structuring the planar layer 7, further circuit elements such as, for example, resistors or interconnects, can be formed form the planar layer 7 outside the bipolar transistor.

As the spaces between the first auxiliary structure 12 and the second auxiliary structure 16 lie at the edges of the emitter terminal 71 and the collector terminal 73 the base terminal 73 is p-doped and the emitter terminal 71 and collector terminal 72 are n-doped. A potential diffusion of donors from the region of the emitter terminal 71 and the collector terminal 72 into the region of the base terminal 73, prior to structuring the planar layer 7, is compensated by the acceptor doping that prevails in these regions.

Figure 12:
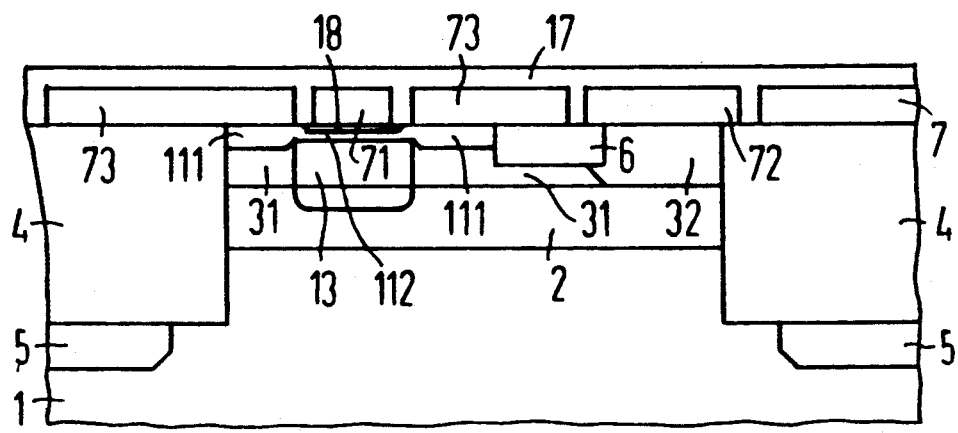

As illustrated in FIG. 12, an oxide layer 17 is deposited across the surface that closes the space between the base terminal 73, the emitter terminal 71 and the collector terminal 72. As a result, the oxide layer 17 also encompasses the residues of the first layer 8. A high-temperature step follows, for example, for a period of 10 seconds at 1050° C., with the assistance of rapid optical annealing (ROA), or for a period of 10 minutes at 900° C., with the assistance of a furnace tempering. As a result of the high-temperature step, an emitter zone 18 is formed by the diffusion of donors from the emitter terminal 71. Further an inactive base 111 is formed by the outdiffusion diffusion of donors from the base terminal 73. A further result of the high-temperature step is the formation of an active base zone 112, between the emitter zone 18 and the pedestal collector 13.

Figure 13:
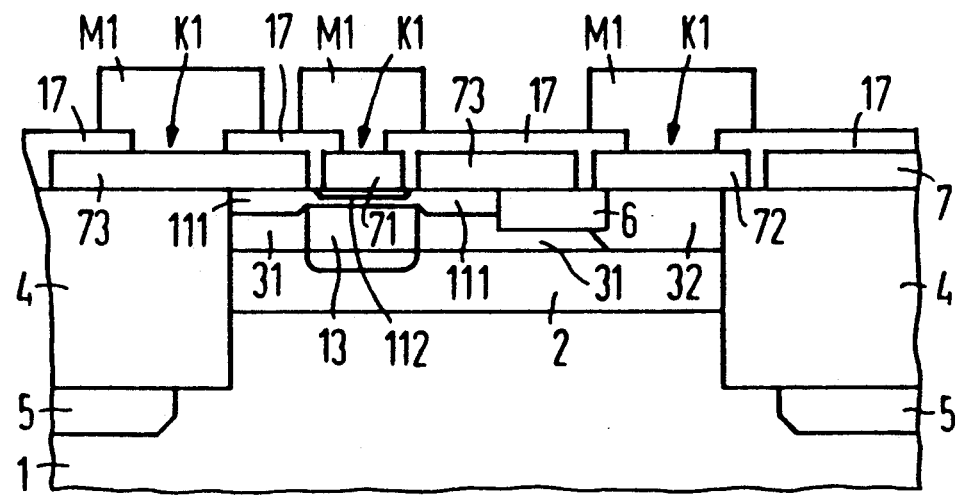
FIG. 13 is a cross sectional view of the resulting bipolar transistor, manufactured in accordance with the principles of the present invention.

As illustrated in FIG. 13, the bipolar transistor of the present invention is completed by opening holes in the oxide layer 17 above the emitter terminal 71, the collector terminal 72 and the base terminal 73, and by metalizing the holes in a known manner.

Figure 14:
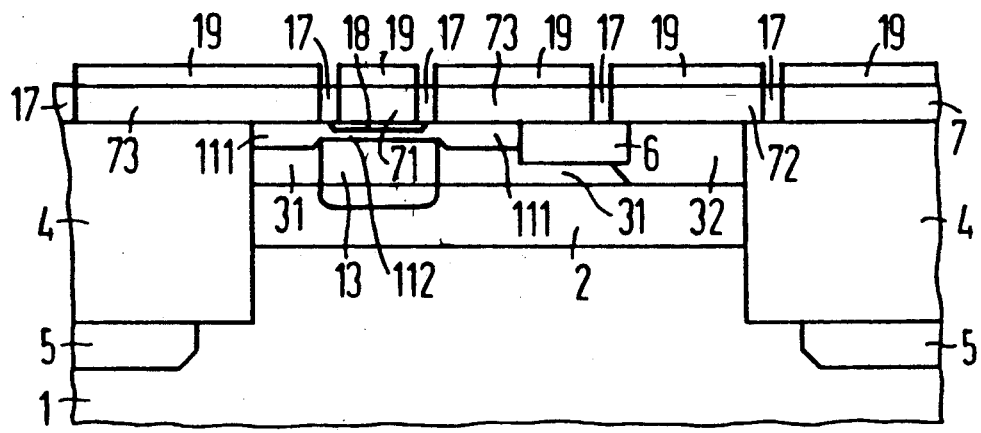
FIG. 14 is a cross sectional view of the resulting bipolar transistor, wherein the base, emitter, and collector terminals are silicidated.

In another embodiment, illustrated in FIG. 14, the oxide layer 17 is first removed in a re-etching step, for example, with the assistance of a reactive ion etching, to such an extent that the surfaces of the base terminal 73, the emitter terminal 71 and the collector terminal 72 are exposed. These exposed regions can be silicidated with the assistance of a salicide technique. For example, this can occur by applying platinum or titanium, and by, subsequently, silicidating and removing the non-reacted, metallic constituents. As a result, a highly conductive layer 19 is selectively produced on the base terminal 73, the emitter terminal 71 and the collector terminal 72. Alternatively, the conductive layer 19 can be produced by a CVD deposition of tungsten or $WSi_x$.

Such an embodiment is advantageous, as a high-temperature step is unnecessary, and thus immobilization of dopants due to compound formation in the silicide or segregation does not occur.

Figure 15:
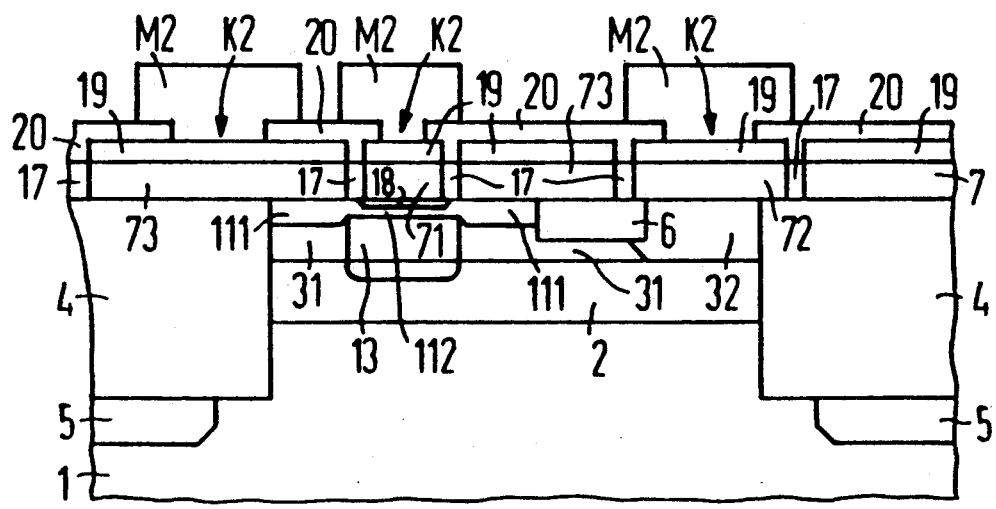
FIG. 15 is a cross sectional view of the resulting bipolar transistor wherein the bipolar transistor is covered with a passivation layer.

Finally the transistor is covered with a passivation layer 20 of, for example, oxide. The holes K2, provided with a metallization M2, are opened in the passivation layer 20 by, for example, a reactive ion etching. Suitable compositions for the metallization M2 include PtSi/-TiW/Al (Si, Cu), TiN/Al (Si, Cu) and W/Al (Si, Cu). The completed bipolar transistor is illustrated in FIG. 15.

In another exemplary embodiment, the planar layer 7, rather than being composed of doped polysilicon, can be composed of a doped silicide, such as $WSi_x$ or a layer combination of a doped polysilicon, diffusion barrier, such as TiN, silicide, that withstands the high-temperature step for diffusion of the donors from the emitter zone 18.

In yet another exemplary embodiment, the first layer 8, second layer 9, third layer 10, first auxiliary layer 14, and second auxiliary layer 15 can be composed of other, mutually selectively etchable materials.

The manufacturing method of the present invention, as discussed above for the fabrication of an npn transistor, can also be applied to the fabrication of a pnp transistor.

Further, the electrical resistance of the base terminal 73, of doped polysilicon, can be reduced by an additional implantation of acceptors, such as boron. A photoresist mask is used in such an implantation to shield n-doped regions of the planar layer 7. Such an implantation step can be implemented subsequent to the structuring of the planar layer 7 and prior to the high-temperature step for producing the emitter zone 18.

I claim:

1. A method for manufacturing a bipolar transistor comprising the steps of:

producing a planar layer across the surface of a substrate, said planar layer being doped with a first conductivity type;

producing a first auxiliary structure on said planar layer, said first auxiliary structure being selectively etchable with respect to said planar layer, said first auxiliary structure covering a region of said planar layer for a base terminal and defining regions of said planar layer for emitter and collector terminals;

depositing a first auxiliary layer across the surface of said first auxiliary structure, and onto exposed regions of said planar layer, said first auxiliary layer providing conformal step coverage, said first auxiliary layer being selectively etchable with respect to said first auxiliary structure and with respect to said planar layer, said first auxiliary layer having a thickness such that the surface of said first auxiliary layer includes first depressions that correspond in shape to said first auxiliary structure;

depositing a second auxiliary layer onto said first auxiliary layer, said second auxiliary layer being selectively etchable with respect to said first auxiliary layer, said second auxiliary layer covering the entire surface of said first auxiliary layer, said first depressions of said first auxiliary layer being completely filled by said second auxiliary layer;

doping said regions of said planar layer for said emitter and collector terminals with a second conductivity type by ion implantation, using first auxiliary structure as an implantation mask, said second conductivity type being opposite said first conductivity type;

producing a second auxiliary structure, self-aligned with respect to said first auxiliary structure, said second auxiliary structure covering said regions for said emitter and collector terminals, said second auxiliary structure being selectively etchable with respect to said planar layer, by etching said second auxiliary layer to expose the surface of said first auxiliary layer, except said first depressions, and by etching the exposed surface of said first auxiliary layer, to expose the surface of said planar layer, said planar layer underlying said first auxiliary layer; and structuring said planar layer, using said first and said second auxiliary structures together as an etching mask, to produce said base terminal and said emitter and collector terminals.

2. The method of claim 1, wherein said second auxiliary layer having a second thickness, said second thickness exceeding the difference between half the greatest distance between opposite side walls of said first auxiliary structure and said first thickness.

3. The method of claim 2, wherein said first thickness is less than one-fourth of the smallest distance between opposite side walls of said first auxiliary structure.

4. The method of claim 1, further comprising the step of applying a first layer onto said planar layer prior to producing said first auxiliary, structure, said first layer being selectively etchable with respect to said planar layer and with respect to said first auxiliary structure, said first layer being selected such that implantation into regions for said base, emitter and collector terminals occurs through said first layer.

5. The method of claim 4, further comprising the steps of:
applying second and third layers onto said first layer, said second layer being selectively etchable with respect to said first layer, and said third layer being selectively etchable with respect to said second layer; and
producing said first auxiliary structure, by anisotropic etching of said second and third layer after producing a photoresist mask.

6. The method of claim 5, wherein said planar layer, said second layer, and said first auxiliary layer consist essentially of polysilicon, and said second auxiliary layer, said first layer, and said third layer consist essentially of silicon oxide.

7. The method of claim 6, further comprising the steps of:
structuring said planar layer by selectively removing residues of said second auxiliary layer with respect to said first underlying auxiliary layer by an anisotropic etching process,
selectively removing residues of said third layer with respect to said underlying second layer by an anisotropic etching process, and
selectively removing exposed regions of said first layer with respect to said underlying planar layer by an anisotropic etching process; and
selectively removing residues of said first auxiliary layer and said second layer with respect to said underlying first layer, and removing exposed regions of said planar layer so that the surface of said substrate is exposed, by an anisotropic etching process.

8. The method of claim 1, further comprising the steps of producing a base zone, doped with said first conductivity type, on said substrate by epitaxial deposition, and epitaxially depositing an emitter zone, doped with said second conductivity type onto said base zone, prior to the step of producing said planar layer.

9. The method of claim 8, wherein said base zone essentially consists of $Si_{1-x}Ge_x$, and $0.1 \leq X \leq 0.3$.

10. The method of claim 8, wherein said emitter zone essentially consists of $Si_{1-x}Ge_x$, and $0.1 \leq X \leq 0.3$.

11. The method of claim 1, further comprising the step of forming a base zone, doped with said first conductivity type, on said substrate by diffusion of donors from said planar layer prior to producing said first auxiliary structure.

12. The method of claim 1, further comprising the step of generating a pedestal collector in said substrate by an additional high-energy implantation of dopant of said second conductivity type subsequent to producing said emitter and collector terminals.

13. A method for manufacturing a bipolar transistor comprising the steps of:
producing a planar layer of a first conductivity type across the surface of a substrate;
producing a first auxiliary structure on said planar layer;
implanting said planar layer using said first auxiliary structure as an implantation mask
producing a self-aligned second auxiliary structure, such that said second auxiliary structure need not be aligned relative to said first auxiliary structure; and
using said first and second auxiliary structures together as an etching mask to produce base, emitter, and collector terminals in said planar layer.

* * * * *